United States Patent [19]
Burghard et al.

[11] 4,117,458
[45] Sep. 26, 1978

[54] HIGH SPEED DOUBLE ERROR CORRECTION PLUS TRIPLE ERROR DETECTION SYSTEM

[75] Inventors: Clement E. Burghard, Huntington Station; Veronica L. Coletti, Bronx, both of N.Y.

[73] Assignee: Grumman Aerospace Corporation, Bethpage, N.Y.

[21] Appl. No.: 774,624

[22] Filed: Mar. 4, 1977

[51] Int. Cl.² .................................. G06F 11/12
[52] U.S. Cl. .................................. 340/146.1 AL
[58] Field of Search ................ 340/146.1 AL; 235/153 AM, 303.2, 312

[56] References Cited

U.S. PATENT DOCUMENTS

| | | | |
|---|---|---|---|
| 3,714,629 | 1/1973 | Hong et al. | 340/146.1 AL |
| 3,814,921 | 6/1974 | Nibby et al. | 235/153 AM |
| 3,851,306 | 11/1974 | Patel | 340/146.1 AL |
| 3,859,630 | 1/1975 | Bennett | 340/146.1 AL |
| 3,896,416 | 7/1975 | Barrett et al. | 340/146.1 AL |
| 4,030,067 | 6/1977 | Howell et al. | 340/146.1 AL |

OTHER PUBLICATIONS

R. T. Chien, Memory Error Control; Beyond Parity, IEEE Spectrum, Jul. 1973, pp. 18–23.
V. K. Malhotra et al., A Double Error-Correction Scheme for Peripheral Systems, IEEE Trans. on Computers, vol. C–25, No. 2, Feb. 1976, pp. 105–114.

*Primary Examiner*—Charles E. Atkinson
*Attorney, Agent, or Firm*—Morgan, Finnegan, Pine, Foley & Lee

[57] ABSTRACT

A single and double error correction and triple detection system using cyclical redundancy codes based on the generator polynomials:

$$G(1171) = X^9 + X^6 + X^5 + X^4 + X^3 + 1$$

$$G(1513) = X^9 + X^8 + X^6 + X^3 + X + 1.$$

20 Claims, 13 Drawing Figures

SINGLE and DOUBLE ERROR DECODES (IN DECIMAL) WITH RESPECTIVE BIT(S) CORRECTION FOR POLYNOMIAL G(1171)

| E № | 1 | 2 | 3 | 4 | 5 | 6 | 7 | 8 | E № | 1 | 2 | 3 | 4 | 5 | 6 | 7 | 8 | E № | 1 | 2 | 3 | 4 | 5 | 6 | 7 | 8 |
|---|---|---|---|---|---|---|---|---|---|---|---|---|---|---|---|---|---|---|---|---|---|---|---|---|---|---|
| 15 | 0 | 0 | 1 | 0 | 0 | 0 | 0 | 0 | 207 | 0 | 0 | 1 | 0 | 0 | 0 | 0 | 0 | 356 | 0 | 0 | 0 | 0 | 0 | 1 | 0 | 0 |
| 27 | 0 | 0 | 0 | 1 | 0 | 0 | 0 | 0 | 209 | 0 | 1 | 1 | 0 | 0 | 0 | 0 | 0 | 371 | 1 | 0 | 1 | 0 | 0 | 0 | 0 | 0 |
| 30 | 0 | 1 | 0 | 0 | 0 | 0 | 0 | 0 | 210 | 0 | 0 | 0 | 0 | 0 | 0 | 1 | 0 | 377 | 0 | 0 | 0 | 0 | 0 | 0 | 0 | 1 |
| 39 | 1 | 0 | 0 | 1 | 0 | 0 | 0 | 0 | 216 | 1 | 0 | 0 | 0 | 1 | 0 | 0 | 0 | 378 | 0 | 1 | 0 | 0 | 0 | 0 | 0 | 0 |
| 54 | 0 | 0 | 1 | 0 | 0 | 0 | 0 | 1 | 222 | 0 | 1 | 0 | 0 | 0 | 0 | 0 | 0 | 380 | 1 | 0 | 0 | 0 | 0 | 0 | 0 | 0 |
| 57 | 0 | 0 | 0 | 0 | 0 | 0 | 0 | 1 | 226 | 0 | 0 | 0 | 0 | 0 | 1 | 0 | 0 | 389 | 0 | 1 | 0 | 1 | 0 | 0 | 0 | 0 |
| 60 | 1 | 0 | 0 | 0 | 0 | 0 | 0 | 0 | 228 | 0 | 0 | 0 | 0 | 0 | 1 | 0 | 0 | 401 | 0 | 0 | 0 | 0 | 1 | 0 | 0 | 0 |
| 71 | 0 | 0 | 1 | 0 | 0 | 0 | 0 | 0 | 231 | 0 | 1 | 0 | 0 | 0 | 0 | 0 | 1 | 411 | 0 | 0 | 0 | 1 | 0 | 0 | 0 | 0 |
| 75 | 0 | 0 | 1 | 0 | 0 | 0 | 0 | 0 | 240 | 0 | 0 | 0 | 0 | 0 | 1 | 0 | 0 | 413 | 0 | 0 | 0 | 0 | 0 | 1 | 0 | 1 |
| 77 | 0 | 0 | 1 | 0 | 0 | 0 | 0 | 0 | 242 | 0 | 0 | 0 | 0 | 0 | 1 | 0 | 0 | 414 | 0 | 1 | 0 | 0 | 0 | 0 | 0 | 0 |
| 78 | 0 | 0 | 1 | 0 | 0 | 0 | 0 | 0 | 243 | 0 | 0 | 0 | 0 | 0 | 1 | 0 | 0 | 417 | 0 | 0 | 0 | 1 | 0 | 0 | 0 | 0 |
| 79 | 0 | 0 | 1 | 0 | 0 | 0 | 0 | 0 | 246 | 0 | 0 | 0 | 0 | 0 | 1 | 0 | 0 | 418 | 1 | 1 | 0 | 0 | 0 | 0 | 0 | 0 |
| 85 | 0 | 0 | 0 | 1 | 1 | 0 | 0 | 0 | 249 | 0 | 0 | 0 | 0 | 0 | 0 | 0 | 1 | 420 | 0 | 0 | 0 | 0 | 1 | 0 | 0 | 0 |
| 89 | 0 | 0 | 0 | 0 | 0 | 0 | 0 | 1 | 250 | 0 | 0 | 0 | 0 | 0 | 1 | 0 | 0 | 427 | 0 | 0 | 1 | 0 | 0 | 1 | 0 | 0 |
| 95 | 0 | 0 | 1 | 0 | 0 | 0 | 0 | 0 | 255 | 0 | 0 | 1 | 0 | 1 | 0 | 0 | 0 | 432 | 0 | 0 | 0 | 0 | 1 | 0 | 0 | 0 |
| 105 | 0 | 0 | 0 | 0 | 0 | 0 | 0 | 1 | 267 | 0 | 0 | 1 | 0 | 0 | 0 | 0 | 0 | 433 | 0 | 0 | 0 | 1 | 0 | 0 | 0 | 0 |
| 108 | 0 | 1 | 0 | 0 | 0 | 1 | 0 | 0 | 275 | 0 | 0 | 1 | 0 | 0 | 0 | 0 | 0 | 435 | 0 | 0 | 0 | 1 | 0 | 0 | 0 | 0 |
| 111 | 0 | 0 | 1 | 0 | 0 | 0 | 0 | 0 | 278 | 0 | 0 | 0 | 0 | 1 | 1 | 0 | 0 | 437 | 0 | 0 | 0 | 1 | 0 | 0 | 0 | 0 |
| 113 | 0 | 0 | 0 | 0 | 0 | 0 | 0 | 1 | 281 | 0 | 0 | 1 | 0 | 0 | 0 | 0 | 0 | 441 | 0 | 0 | 0 | 1 | 0 | 0 | 0 | 0 |
| 114 | 0 | 0 | 0 | 0 | 0 | 1 | 0 | 0 | 282 | 0 | 0 | 1 | 0 | 0 | 0 | 0 | 0 | 444 | 1 | 0 | 0 | 0 | 0 | 0 | 0 | 0 |
| 120 | 0 | 0 | 0 | 0 | 0 | 0 | 0 | 1 | 283 | 0 | 0 | 1 | 0 | 0 | 0 | 0 | 0 | 452 | 0 | 0 | 0 | 0 | 0 | 1 | 0 | 0 |
| 121 | 0 | 0 | 0 | 0 | 0 | 0 | 0 | 1 | 284 | 1 | 0 | 0 | 0 | 0 | 0 | 0 | 0 | 456 | 0 | 0 | 0 | 1 | 0 | 0 | 0 | 1 |
| 123 | 0 | 0 | 0 | 0 | 0 | 0 | 0 | 1 | 287 | 0 | 0 | 1 | 0 | 0 | 0 | 0 | 0 | 462 | 1 | 0 | 0 | 0 | 0 | 0 | 1 | 0 |
| 125 | 0 | 0 | 0 | 0 | 0 | 0 | 0 | 1 | 303 | 0 | 1 | 0 | 1 | 0 | 0 | 0 | 0 | 480 | 0 | 0 | 0 | 0 | 0 | 1 | 0 | 0 |
| 139 | 0 | 0 | 0 | 0 | 0 | 1 | 1 | 0 | 305 | 0 | 0 | 0 | 1 | 0 | 0 | 0 | 0 | 484 | 0 | 0 | 0 | 0 | 0 | 1 | 0 | 0 |
| 141 | 1 | 0 | 0 | 1 | 0 | 0 | 0 | 0 | 308 | 1 | 0 | 0 | 0 | 0 | 0 | 0 | 0 | 485 | 0 | 0 | 0 | 0 | 0 | 1 | 0 | 0 |
| 142 | 0 | 1 | 0 | 0 | 0 | 0 | 0 | 0 | 312 | 1 | 0 | 0 | 0 | 0 | 0 | 0 | 0 | 486 | 0 | 0 | 0 | 0 | 0 | 1 | 0 | 0 |
| 150 | 0 | 1 | 0 | 0 | 0 | 0 | 0 | 0 | 315 | 0 | 0 | 1 | 0 | 0 | 0 | 0 | 0 | 489 | 0 | 0 | 1 | 0 | 0 | 1 | 0 | 0 |
| 154 | 0 | 1 | 0 | 0 | 0 | 0 | 0 | 0 | 316 | 1 | 0 | 0 | 0 | 0 | 0 | 0 | 0 | 492 | 0 | 0 | 0 | 0 | 0 | 1 | 0 | 0 |
| 156 | 0 | 1 | 0 | 0 | 0 | 0 | 0 | 0 | 317 | 1 | 0 | 0 | 0 | 0 | 0 | 0 | 0 | 497 | 0 | 0 | 0 | 1 | 0 | 0 | 0 | 0 |
| 158 | 0 | 1 | 0 | 0 | 0 | 0 | 0 | 0 | 318 | 1 | 0 | 0 | 0 | 0 | 0 | 0 | 0 | 498 | 0 | 0 | 0 | 0 | 0 | 1 | 0 | 0 |
| 159 | 0 | 1 | 0 | 0 | 0 | 0 | 0 | 0 | 323 | 0 | 0 | 0 | 1 | 0 | 1 | 0 | 0 | 500 | 0 | 0 | 0 | 0 | 1 | 0 | 0 | 0 |
| 170 | 0 | 0 | 0 | 1 | 1 | 0 | 0 | 0 | 325 | 1 | 0 | 0 | 0 | 0 | 0 | 0 | 1 | 510 | 0 | 0 | 1 | 0 | 1 | 0 | 0 | 0 |
| 177 | 0 | 0 | 0 | 0 | 1 | 0 | 0 | 0 | 335 | 0 | 0 | 1 | 0 | 0 | 0 | 0 | 0 | | | | | | | | | |
| 178 | 0 | 0 | 0 | 0 | 0 | 1 | 0 | 0 | 340 | 0 | 0 | 1 | 1 | 0 | 0 | 0 | 0 | | | | | | | | | |
| 189 | 0 | 0 | 1 | 0 | 0 | 1 | 0 | 0 | 347 | 0 | 0 | 1 | 0 | 0 | 0 | 0 | 0 | | | | | | | | | |
| 190 | 0 | 1 | 0 | 0 | 0 | 0 | 0 | 0 | 354 | 0 | 0 | 1 | 0 | 0 | 0 | 0 | 1 | | | | | | | | | |

FIG.6

TRIPLE ERROR DECODES (IN DECIMAL) FOR POLYNOMIAL G(1171)

TENS / UNITS

| TENS | 0 | 1 | 2 | 3 | 4 | 5 | 6 | 7 | 8 | 9 |
|---|---|---|---|---|---|---|---|---|---|---|
| 0  |   |   |   |   |   |   |   | X |   |   |
| 1  |   | X |   | X | X |   |   |   |   | X |
| 2  |   | X | X | ø |   | X | X |   | X | ø |
| 3  |   | X |   |   |   | X |   | X | X |   |
| 4  |   | X | X | ø | X | ø | ø | X |   | X |
| 5  | X | ø | X | ø |   | X | X |   | ø | X |
| 6  |   | X | X | ø |   |   |   | X |   | X |
| 7  | X |   |   | X | X |   | X |   |   |   |
| 8  |   | X | X | ø | X |   | ø | X | X |   |
| 9  | ø | X | ø | X | X |   |   | X | X | ø |
| 10 | X | ø | ø | X | X |   | ø | X |   | X |
| 11 | X |   | X |   |   | X | ø | X | X | ø |
| 12 |   |   | X |   | X |   | ø | X |   |   |
| 13 |   | X | X |   | X | ø |   | X | X |   |
| 14 | X |   |   | X |   | X | X | ø | X | ø |
| 15 |   | X | X | ø |   | X |   | X |   |   |
| 16 |   | X | X | ø | X | ø | ø | X | X | ø |
| 17 |   | X | ø | X | X | ø | X |   |   | X |
| 18 | ø | X | X | ø | ø | X | X | ø | X |   |
| 19 |   | X |   | X | X | ø | X | ø | ø | X |
| 20 | X | ø | ø | X | ø | X | X |   | X |   |
| 21 |   | X | ø | X | X | ø |   | X | X | ø |
| 22 | X | ø |   | X | X | ø |   | X |   | X |
| 23 | X |   | ø | X | X | ø | X | ø | ø | X |
| 24 |   | X |   |   | X | ø |   | X | X |   |
| 25 |   | X | ø | X | X |   |   |   |   | X |

| TENS | 0 | 1 | 2 | 3 | 4 | 5 | 6 | 7 | 8 | 9 |
|---|---|---|---|---|---|---|---|---|---|---|
| 26 |   | X | X | ø |   | X | X |   | X | ø |
| 27 | ø | X |   | X | X |   | X | ø |   | X |
| 28 | X |   |   |   | X | X |   |   |   | X |
| 29 | X | ø | X | ø | ø | X | X | ø | ø | X |
| 30 |   | X | X |   | X |   | ø | X |   | X |
| 31 | X | ø |   | X | X |   |   |   |   | X |
| 32 |   | X | X |   | X |   | ø | X | X | ø |
| 33 | ø | X | ø | X | X |   | X | ø | ø | X |
| 34 |   | X | X | ø | ø | X | X |   | X | ø |
| 35 |   | X | X | ø |   | X |   | X | X | ø |
| 36 | ø | X | X | ø | X | ø | ø | X | ø | X |
| 37 | X |   | X | ø | ø | X | X |   |   | X |
| 38 |   | X | X | ø |   | X | X | ø | X |   |
| 39 | ø | X | X | ø | ø | X | ø | X | X | ø |
| 40 | X |   | ø | X | ø | X | X |   | ø | X |
| 41 | X |   | X |   |   | X | X |   |   | X |
| 42 |   | X | X | ø | ø | X | X |   | X | ø |
| 43 | ø | X |   |   | X |   | X |   | ø | X |
| 44 | X |   | ø | X |   | X | X | ø | X | ø |
| 45 | ø | X |   | X | X | ø |   | X | X | ø |
| 46 | X | ø |   | X | ø | X | X | ø | X | ø |
| 47 | ø | ø | X | ø | ø | X | ø | X | X | ø |
| 48 |   | X | X | ø |   |   |   | X | X |   |
| 49 |   | X |   | X | X | ø | X |   |   | X |
| 50 |   | X | X | ø | ø | X | X | ø | X | ø |
| 51 |   | X | — NOT USED — | | | | | | | |

FIG.7

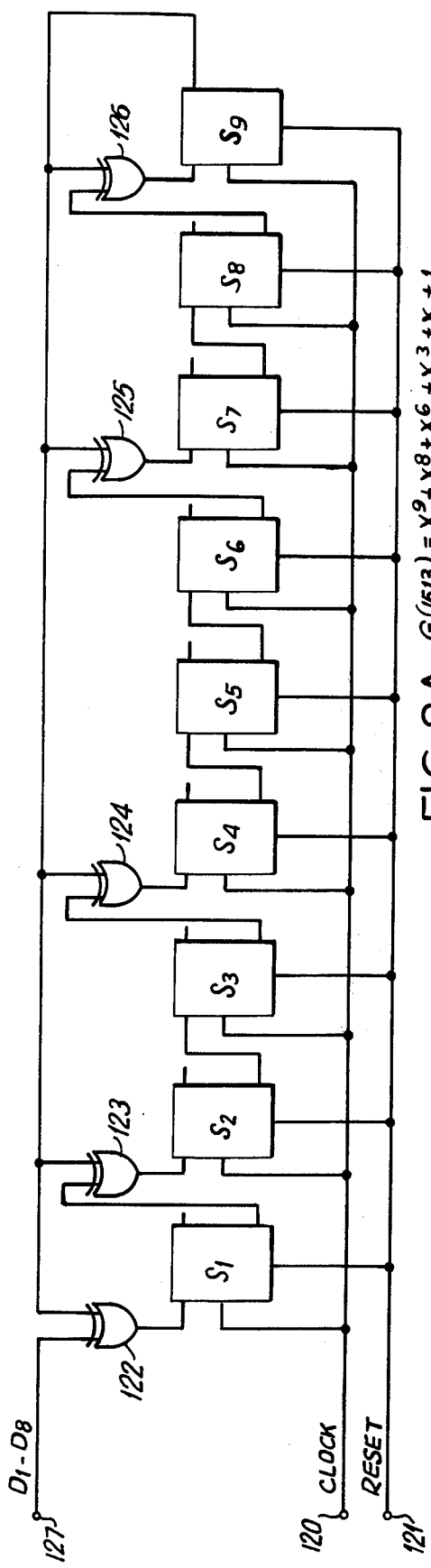

SINGLE and DOUBLE DECODES (POLYNOMIAL 1513)

| D №. | \multicolumn{8}{c}{BIT CORRECTION} | D №. | \multicolumn{8}{c}{BIT CORRECTION} | D №. | \multicolumn{8}{c}{BIT CORRECTION} |
|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | | 1 | 2 | 3 | 4 | 5 | 6 | 7 | 8 | | 1 | 2 | 3 | 4 | 5 | 6 | 7 | 8 |
| 15 | 0 | 0 | 0 | 1 | 0 | 0 | 0 | 0 | 249 | 0 | 0 | 0 | 0 | 1 | 0 | 0 | 0 | 401 | 0 | 0 | 1 | 1 | 0 | 0 | 0 | 0 |
| 30 | 0 | 0 | 1 | 0 | 0 | 0 | 0 | 0 | 252 | 0 | 0 | 1 | 0 | 1 | 0 | 0 | 0 | 413 | 0 | 0 | 0 | 0 | 0 | 0 | 1 | 0 |
| 60 | 0 | 1 | 0 | 0 | 0 | 0 | 0 | 1 | 267 | 0 | 0 | 0 | 0 | 0 | 0 | 0 | 1 | 414 | 0 | 0 | 1 | 0 | 0 | 0 | 0 | 0 |
| 63 | 0 | 0 | 0 | 0 | 1 | 0 | 1 | 0 | 270 | 0 | 0 | 1 | 0 | 0 | 0 | 0 | 0 | 417 | 1 | 0 | 0 | 0 | 0 | 0 | 0 | 0 |
| 71 | 1 | 0 | 0 | 0 | 1 | 0 | 0 | 0 | 275 | 0 | 0 | 0 | 0 | 1 | 1 | 0 | 0 | 418 | 0 | 0 | 0 | 0 | 1 | 0 | 0 | 0 |
| 75 | 0 | 0 | 0 | 0 | 0 | 0 | 0 | 1 | 278 | 0 | 0 | 1 | 0 | 0 | 0 | 0 | 0 | 420 | 1 | 0 | 0 | 0 | 0 | 0 | 0 | 0 |
| 85 | 0 | 0 | 1 | 0 | 0 | 0 | 0 | 1 | 282 | 0 | 0 | 1 | 0 | 0 | 0 | 0 | 0 | 421 | 1 | 0 | 0 | 0 | 0 | 0 | 0 | 0 |
| 105 | 0 | 1 | 1 | 0 | 0 | 0 | 0 | 0 | 284 | 0 | 0 | 1 | 0 | 0 | 0 | 0 | 0 | 423 | 1 | 0 | 0 | 0 | 0 | 0 | 0 | 0 |
| 113 | 0 | 0 | 0 | 0 | 0 | 1 | 0 | 0 | 286 | 0 | 0 | 1 | 0 | 0 | 0 | 0 | 0 | 429 | 1 | 0 | 0 | 0 | 0 | 0 | 0 | 0 |
| 119 | 0 | 1 | 0 | 0 | 0 | 0 | 0 | 0 | 287 | 0 | 0 | 1 | 0 | 0 | 0 | 0 | 0 | 437 | 1 | 0 | 0 | 0 | 0 | 0 | 0 | 0 |
| 120 | 0 | 1 | 0 | 0 | 0 | 1 | 0 | 0 | 293 | 1 | 0 | 0 | 0 | 0 | 0 | 0 | 0 | 442 | 0 | 0 | 0 | 0 | 0 | 1 | 0 | 1 |
| 126 | 0 | 0 | 0 | 1 | 0 | 1 | 0 | 0 | 298 | 1 | 0 | 0 | 1 | 0 | 0 | 0 | 0 | 450 | 0 | 0 | 0 | 0 | 1 | 0 | 0 | 0 |
| 135 | 0 | 0 | 0 | 1 | 0 | 0 | 0 | 0 | 300 | 0 | 0 | 0 | 0 | 0 | 1 | 1 | 0 | 452 | 0 | 0 | 0 | 1 | 0 | 0 | 0 | 0 |
| 139 | 0 | 0 | 0 | 1 | 0 | 0 | 0 | 0 | 311 | 0 | 1 | 0 | 0 | 0 | 0 | 0 | 0 | 459 | 0 | 0 | 0 | 0 | 0 | 0 | 0 | 1 |
| 141 | 0 | 0 | 0 | 1 | 0 | 0 | 0 | 0 | 318 | 0 | 0 | 1 | 0 | 0 | 0 | 0 | 0 | 461 | 0 | 0 | 0 | 0 | 0 | 0 | 1 | 0 |
| 142 | 0 | 0 | 0 | 1 | 0 | 0 | 0 | 0 | 323 | 0 | 0 | 0 | 0 | 0 | 0 | 0 | 1 | 469 | 0 | 0 | 0 | 0 | 0 | 0 | 1 | 0 |
| 143 | 0 | 0 | 0 | 1 | 0 | 0 | 0 | 0 | 329 | 0 | 0 | 0 | 0 | 0 | 0 | 0 | 1 | 473 | 0 | 0 | 0 | 0 | 0 | 0 | 1 | 0 |
| 149 | 0 | 1 | 0 | 1 | 0 | 0 | 0 | 0 | 330 | 0 | 0 | 0 | 0 | 0 | 0 | 0 | 1 | 476 | 0 | 0 | 0 | 0 | 0 | 0 | 1 | 0 |
| 150 | 0 | 0 | 0 | 0 | 0 | 0 | 1 | 1 | 331 | 0 | 0 | 0 | 0 | 0 | 0 | 0 | 1 | 477 | 0 | 0 | 0 | 0 | 0 | 0 | 1 | 0 |
| 159 | 0 | 0 | 0 | 1 | 0 | 0 | 0 | 0 | 335 | 0 | 0 | 0 | 0 | 0 | 0 | 0 | 1 | 479 | 0 | 0 | 0 | 0 | 0 | 0 | 1 | 0 |
| 165 | 1 | 0 | 0 | 0 | 0 | 0 | 0 | 0 | 338 | 0 | 0 | 0 | 1 | 0 | 0 | 1 | 0 | 480 | 0 | 0 | 0 | 1 | 0 | 0 | 0 | 0 |
| 169 | 0 | 0 | 0 | 0 | 1 | 0 | 0 | 1 | 340 | 1 | 0 | 0 | 0 | 0 | 1 | 0 | 0 | 482 | 0 | 0 | 0 | 0 | 1 | 0 | 0 | 0 |
| 170 | 0 | 1 | 0 | 0 | 0 | 0 | 1 | 0 | 343 | 0 | 1 | 0 | 0 | 0 | 0 | 0 | 0 | 483 | 0 | 0 | 0 | 0 | 1 | 0 | 0 | 0 |
| 175 | 0 | 0 | 0 | 1 | 0 | 0 | 0 | 0 | 347 | 0 | 0 | 0 | 0 | 0 | 0 | 0 | 1 | 485 | 1 | 0 | 0 | 0 | 0 | 0 | 0 | 0 |
| 177 | 0 | 0 | 0 | 0 | 0 | 1 | 0 | 0 | 349 | 0 | 0 | 0 | 0 | 0 | 0 | 1 | 0 | 486 | 0 | 0 | 0 | 0 | 1 | 0 | 0 | 0 |
| 187 | 1 | 0 | 1 | 0 | 0 | 0 | 0 | 0 | 350 | 0 | 0 | 1 | 0 | 0 | 0 | 0 | 0 | 490 | 0 | 0 | 0 | 0 | 1 | 0 | 0 | 0 |
| 195 | 0 | 0 | 1 | 0 | 0 | 0 | 1 | 0 | 354 | 0 | 0 | 0 | 0 | 1 | 0 | 0 | 0 | 495 | 0 | 0 | 1 | 0 | 0 | 0 | 0 | 0 |
| 207 | 0 | 0 | 0 | 1 | 0 | 0 | 0 | 0 | 359 | 0 | 1 | 0 | 0 | 0 | 0 | 0 | 0 | 497 | 0 | 0 | 0 | 0 | 1 | 0 | 0 | 0 |
| 209 | 0 | 0 | 0 | 0 | 0 | 1 | 0 | 0 | 363 | 0 | 0 | 0 | 0 | 0 | 0 | 0 | 1 | 498 | 0 | 0 | 0 | 1 | 0 | 0 | 0 | 0 |
| 210 | 1 | 1 | 0 | 0 | 0 | 0 | 0 | 0 | 365 | 0 | 0 | 0 | 1 | 1 | 0 | 0 | 0 | 503 | 0 | 1 | 0 | 0 | 0 | 0 | 0 | 0 |
| 221 | 0 | 0 | 0 | 0 | 0 | 0 | 1 | 0 | 371 | 0 | 1 | 0 | 0 | 0 | 0 | 0 | 0 | 504 | 0 | 1 | 0 | 1 | 0 | 0 | 0 | 0 |
| 225 | 0 | 0 | 0 | 0 | 0 | 1 | 0 | 0 | 373 | 0 | 1 | 0 | 0 | 0 | 0 | 0 | 0 | 509 | 0 | 0 | 0 | 0 | 0 | 0 | 1 | 0 |
| 226 | 0 | 0 | 0 | 1 | 0 | 0 | 0 | 0 | 374 | 0 | 1 | 0 | 0 | 0 | 0 | 0 | 0 | | | | | | | | | |
| 238 | 1 | 0 | 0 | 0 | 0 | 0 | 0 | 1 | 375 | 0 | 1 | 0 | 0 | 0 | 0 | 0 | 0 | | | | | | | | | |
| 240 | 0 | 0 | 0 | 0 | 0 | 1 | 0 | 0 | 383 | 0 | 1 | 0 | 0 | 0 | 0 | 0 | 0 | | | | | | | | | |
| 241 | 0 | 0 | 0 | 0 | 0 | 1 | 0 | 0 | 389 | 1 | 0 | 0 | 0 | 0 | 0 | 0 | 0 | | | | | | | | | |
| 243 | 0 | 0 | 0 | 0 | 1 | 0 | 0 | 0 | 390 | 0 | 1 | 0 | 0 | 1 | 0 | 0 | 0 | | | | | | | | | |
| 245 | 0 | 0 | 0 | 0 | 1 | 0 | 0 | 0 | 399 | 0 | 0 | 1 | 0 | 0 | 0 | 0 | 0 | | | | | | | | | |

FIG. 10

TRIPLE ERROR DECODES (POLYNOMIAL 1513)

TENS / UNITS

| TENS | 0 | 1 | 2 | 3 | 4 | 5 | 6 | 7 | 8 | 9 |
|---|---|---|---|---|---|---|---|---|---|---|
| 0 |   |   |   |   |   |   |   | X |   |   |
| 1 |   | X |   | X | X |   |   |   |   | X |
| 2 |   | X | X | ø |   | X | X | ø | X | ø |
| 3 |   | X |   |   | X |   |   | X | X | ø |
| 4 |   | X | X | ø | X | ø | ø | X |   | X |
| 5 | X | ø | X | ø | ø | X | X | ø | ø | X |
| 6 |   | X | X |   |   |   |   | X |   | X |
| 7 | X |   |   | X | X |   | X | ø | ø | X |
| 8 |   | X | X | ø | X |   | ø | X | X | ø |
| 9 | ø | X | ø | X | X | ø |   | X | X | ø |
| 10 | X | ø | ø | X | X |   | ø | X | ø | X |
| 11 | X | ø | X |   | ø | X | ø | X | X |   |
| 12 |   | X | X | ø | X | ø |   | X |   |   |
| 13 |   | X |   | X | X |   |   | X | X |   |
| 14 | X |   |   |   | X | X | ø | X |   |   |
| 15 |   | X | X | ø | ø | X | ø | X | X |   |
| 16 |   | X | X | ø | X |   | ø | X | X |   |
| 17 |   | X | ø | X | X |   | X |   | ø | X |
| 18 | ø | X | X | ø | ø | X | X |   | X | ø |
| 19 | ø | X |   | X | X |   | X | ø | ø | X |
| 20 | X | ø | ø | X | ø | X | X |   | X |   |
| 21 |   | X | ø | X | X | ø | ø | X | X | ø |
| 22 | X |   | ø | X | X |   |   | X | ø | X |
| 23 | X | ø | ø | X | X | ø | X | ø |   | X |
| 24 |   | X |   | X |   | ø | X | X |   |   |
| 25 | ø | X |   | X | X | ø |   |   |   | X |
| 26 |   | X | X | ø |   | X | X |   | X | ø |
| 27 |   | X |   | X | X |   | X | ø |   | X |
| 28 | X | ø |   | X |   | X |   |   |   | X |
| 29 | X | ø | X |   | ø | X | X | ø |   | X |
| 30 |   | X | X | ø | X | ø | ø | X | ø | X |
| 31 | X |   |   | ø | ø | X | ø | X | ø |   | X |
| 32 |   | X | X |   | X | ø | ø | X | X |   |
| 33 |   |   | ø | X | X |   | X | ø |   | X |
| 34 |   | X | X |   | ø | X | X |   | X |   |
| 35 |   | X | X | ø |   | X | ø | X | X |   |
| 36 | ø | X | X |   | X |   | ø | X | ø | X |
| 37 | X |   | X |   |   |   | X | ø | ø | X |
| 38 | ø | X | X |   |   | X | X |   | ø | X |
| 39 |   | X | X | ø | ø | X | ø | X | X |   |
| 40 | X |   | ø | X | ø | X | X | ø | ø | X |
| 41 | X | ø | X |   |   | X | X |   |   | X |
| 42 |   | X |   |   | ø | X | X | ø | X |   |
| 43 | ø | X | ø | X | X | ø | X |   | ø | X |
| 44 | X | ø |   | X | ø | X | X | ø | X | ø |
| 45 |   | X |   | X | X | ø | ø | X | X |   |
| 46 | X |   | ø | X | ø | X | X | ø | X |   |
| 47 | ø | X | X |   | ø | X |   |   | X |   |
| 48 |   | X |   |   | X |   |   | X | X | ø |
| 49 |   | X | ø | X | X |   | X |   |   | X |
| 50 | ø | X | X |   |   | X | X | ø | X |   |
| 51 | ø | X | — NOT USED — |

FIG.11

HIGH SPEED DOUBLE ERROR CORRECTION PLUS TRIPLE ERROR DETECTION SYSTEM

BACKGROUND OF THE INVENTION

This invention relates to a system for correcting all single and double errors and for detecting all triple errors in data recording or data transmission.

In data communication systems it is important to incorporate data error detection and/or data error correction facilities. When data is transmitted from point to point, transmission line noise or interruptions can introduce errors which must be detected and/or corrected if the data integrity is to be maintained. Likewise, in recording and recovering data from memory, error detection and/or correction is required to insure that the data has not changed while in storage or during recovery.

A known technique employed in the past has involved the use of cyclical redundancy codes for the generation of parity bits which are transmitted or stored together with the data bits. See, for example, "Error Correcting Codes" by W. W. Peterson, MIT Press, 1961. In such systems the integrity of the data bits can be determined by again generating a set of parity bits from the recovered data bits and comparing the new parity bits with the previously encoded parity bits. If the new parity bits are identical to the previously encoded parity bits, error free data can be assumed.

In the usual procedure the parity bits are derived by operating on the serial data bits of the data message as though they are coefficients of a long binary polynomial $D(X)$. Mathematically, the data polynomial is divided by a generator polynomial $G(X)$ producing a quotient $Q(X)$ and error remainder $R(X)$.

$$D(X)/G(X) = Q(X) + R(X). \quad (1)$$

The quotient is discarded and $R(X)$ is used as a set of parity bits. The parity bits $P(X)$ are concatenated to the data bits $D(X)$. Thus, the encoded message word $M(X)$ that is transmitted or recorded is represented:

$$M(X) = D(X) + P(X). \quad (2)$$

When checking a previously encoded word $N(X)$ to determine if the data portion is correct, it is divided by the same polynomial generator to derive error parity bits $E(X)$:

$$N(X)/G(X) = Q(X) + E(X). \quad (3)$$

If the previously encoded parity bits agree with the error detection parity bits, then $N(X) = D(X)$ and error free transmission can therefore be assumed.

Although cyclical redundancy codes usually employ a serial implementation, parallel implementations are known. See, for example, "Parallel CRC lets many lines use one circuit" by Arun K. Pandeya and Thomas J. Cassa, *Computer Design*, September, 1975, Vol. 14, No. 9, pages 87–91.

Where the generator polynomial is selected such that the difference between the original parity bits and the error detection parity bits yield error decodes which can be uniquely correlated to specific errors, these error decodes can also be used to achieve error correction.

BRIEF SUMMARY OF THE INVENTION

The invention is based on the discovery of specific generator polynomials capable of providing single and double error correction and triple error detection with a minimum number of parity bits. Out of all of the possible generator polynomials, two have been found for operating on eight bit data messages which provide single and double error correction and triple error detection while requiring no more than nine parity bits.

The unique generator polynomials discovered according to this invention are:

$$G(1171) = X^9 + X^6 + X^5 + X^4 + X^3 + 1 \quad (4)$$

$$G(1513) = X^9 + X^8 + X^6 + X^3 + X^1 + 1 \quad (5)$$

The parity system according to the invention can be employed in either a series or parallel implementation to provide both the error correction and error detection.

BRIEF DESCRIPTION OF THE DRAWINGS

The invention is described more particularly in connection with the following drawings which set forth illustrative embodiments of the invention and wherein:

FIG. 6 is the complete error decode table for the single and double errors for the generator polynomial G(1171);

FIG. 7 is a table indicating the error decodes for triple error detection using the generator polynomial G(1171);

FIG. 8A is a polynomial operator for dividing an eight bit data word by the generator polynomial G(1513) and FIG. 8B is a table illustrating the generation of parity bits by this polynomial generator;

FIG. 10 is a table setting forth the single and double error decodes for the generator polynomial G(1513); and FIG. 11 is a table setting forth the triple error decodes for the generator polynomial G(1513).

DETAILED DESCRIPTION OF THE INVENTION

Figure 1:
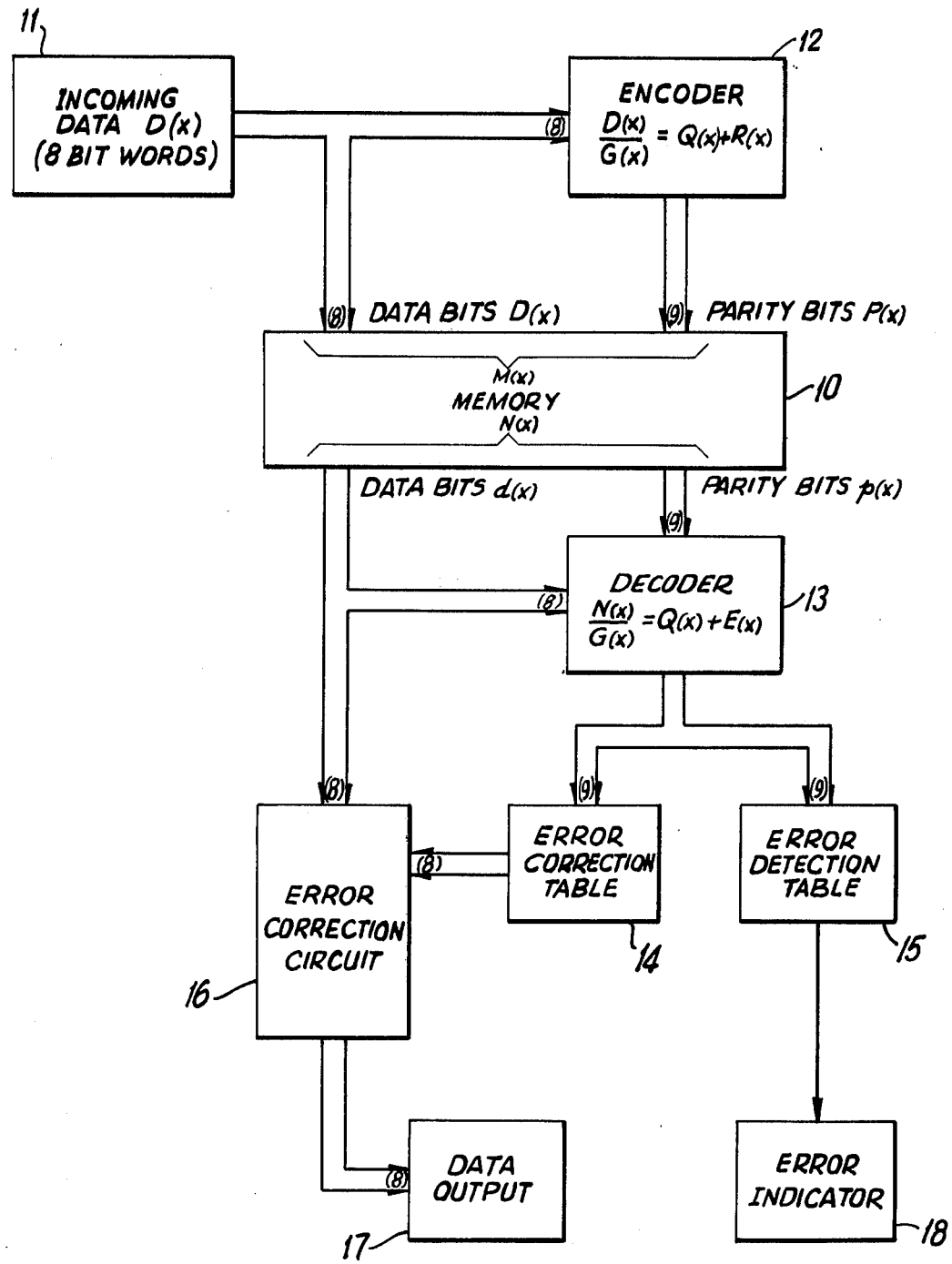
FIG. 1 is a block diagram illustrating the encoding and decoding apparatus according to the invention used in connection with a random access.

FIG. 1 shows the parity system according to the invention in the form for recording encoded data in a random access memory 10 and for checking and correcting data upon retrieval from the memory. Although this arrangement is shown for illustration of the invention it should be apparent that the invention is equally applicable to data transmission systems.

The incoming data 11 is in the form of eight bit data words conventionally used in most digital systems. The data D(X) goes to an encoder 12 where the data is divided by the polynomial generator G(X) to develop nine parity bits R(X). The nine parity bits are concatenated to the eight data bits and recorded together in memory 10 as a seventeen bit encoded word M(X).

When the previously encoded word is retrieved from the memory it may contain errors and is therefore given a different designation N(X) is distinguish from the error free encoded word M(X).

The previously encoded word N(X) is divided by the same polynomial generator G(X) and the newly generated parity bits are then compared with those retrieved from the memory. If the parity bits are the same, error free recording and retrieval can be assumed. On the other hand, if the parity bits do not agree, the result is a nine bit error decode E(X) which represents the difference between the two sets of parity bits.

In accordance with the invention the polynomial generator G(X) is selected so that all possible single and double errors have unique error decodes. For example, using one of the polynomial generators according to the invention an error decode E(316) = 100111100 will occur only if the first data bit is in error. Error decode E(418) = 110100010 occurs only if the first and second data bits are both in error. In similar fashion each possible single error and each possible double error has a corresponding error decode which does not correspond to any other single, double or higher order detectable error.

The error correction table containing all the values of E(X) corresponding to the single and double errors is recorded in a ROM (read-only memory) 14. The memory is arranged so that whenever an error decode is applied corresponding to a single or double error, the memory will produce an eight bit word indicating the location of the error or errors. The output from memory 14 is used to control an error correction circuit 16 which automatically corrects the data as it passes from the memory 10 to the data output circuitry 17.

Another ROM is used to record the error decodes for the triple errors and higher order detectable errors. This memory records all values for error decodes E(X) other than the error decodes corresponding to single and double errors since the latter are correctable and not to be indicated as data errors. When an error decode corresponds to one of the values recorded in ROM 15, an error indicator 18 is activated to indicate to the computing system that the data contains an uncorrected error.

The polynomial generators according to the invention are selected to provide unique error decodes for all single and double errors and to insure that all triple errors are detectable. In addition, the polynomial generators have been selected to detect about 70% of all the triple and higher order errors.

Serial Encoder for Generator Polynomial G(1171)

Figure 2:
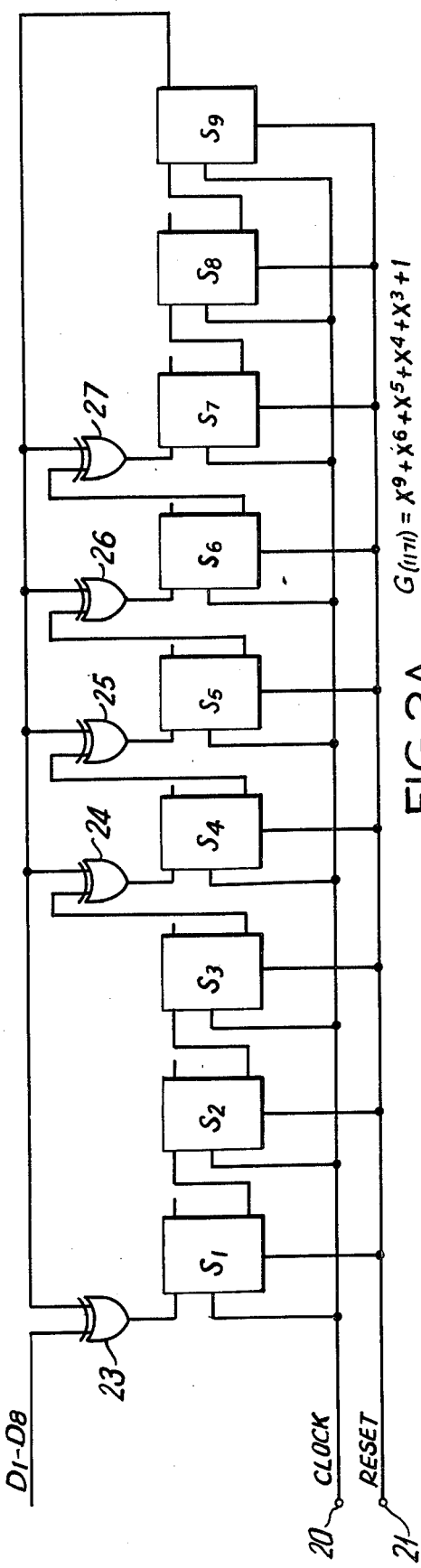
FIG. 2A is a schematic diagram illustrating a polynomial operator for dividing an eight bit word by the polynomial G(1171)
FIG. 2B is a table describing the operation developing the parity bits.

The encoder 12 in FIG. 1 for a system using the generator polynomial G(1171) can operate on the data in serial fashion using a nine stage shift register as shown in FIG. 2A. Each of the shift register stages $S_1$-$S_9$ is coupled to a common clock pulse terminal 20 and a common reset terminal 21. The ninth stage is fed back to the first fourth, fifth, sixth and seventh stages via separate exclusive OR circuits 23-27 respectively. The other input of OR circuit 23 is connected to pass the incoming data D(X) = $D_1$ ... $D_8$ to the first stage $S_1$ of the shift register in synchronism with clock pulses applied to clock pulse terminal 20. The other inputs of exclusive OR circuits 24-27 are coupled to the output from the previous stage of the shift register.

With this arrangement the output of the ninth stage is fed back nine stages to the first stage $S_1$, is fed back six stages to the fourth stage $S_4$, is fed back five stages to the fifth stage $S_5$, is fed back four stages to the sixth stage $S_6$, is fed back three stages to the seventh stage $S_7$. Thus the feedbacks correspond to the generator polynomial:

$$G(1171) = X^9 + X^6 + X^5 + X^4 + X^3 + 1.$$

The manner in which the parity bits are formed is illustrated in FIG. 2B.

Assume that the shift register is initially cleared by application of a pulse to reset terminal 21. Thereafter, the eight bits of data word D(X) are stepped into the shift register in synchronism with clock pulses. After eight clock pulses they occupy stages $S_1$ through $S_8$. The ninth clock pulse advances the data one step so that the data bits $D_1$-$D_8$ occupy stages $S_2$-$S_9$ as is indicated in the left most column in FIG. 2B under the heading shift number "9". The application of the tenth clock pulse brings the feedback into play. Since data bit $D_8$ occupies stage $S_9$, this data bit is fed back to stages $S_1$, $S_4$, $S_5$, and $S_7$ where it is combined (Mod-2 additions) with the data bit advancing from the previous stage. The resulting data distribution in the shift register is thus as indicated in FIG. 2B under the column heading shift number "10".

The eleventh clock pulse results in feedback of data bit $D_7$ and the twelfth clock pulse results in feedback of data bit $D_6$, the data distributions being as indicated in FIG. 2B under the columns headed shift "11" and "12", respectively.

It should be noted from FIG. 2B that following the twelfth clock pulse the shift register stage $S_9$ holds the Mod-2 summation of data bits $D_5$ and $D_8$ and thus, when the next clock pulse is applied this sum is fed back to the prior stages. Likewise, it can be seen from FIG. 2B that the data in the ninth stage following each successive shift is a sum of several data bits and, in each case, it is the sum which is fed back.

After seventeen clock pulses the operation is complete and the data in the nine stages of the shift register correspond to the remainder R(X) resulting from the division of the data word D(X) by the generator polynomial G(1171). The summations (Mod-2) indicated in the right most column of FIG. 2B determine the parity bits P(X) and, hence, are the parity equations for the polynomial generator G(1171) according to this invention. The nine parity bits are recorded in the memory 10 (FIG. 1) together with the eight data bits to thereby form the encoded word M(X).

Parallel Encoder for Polynomial G(1171)

Figures 3, 4:
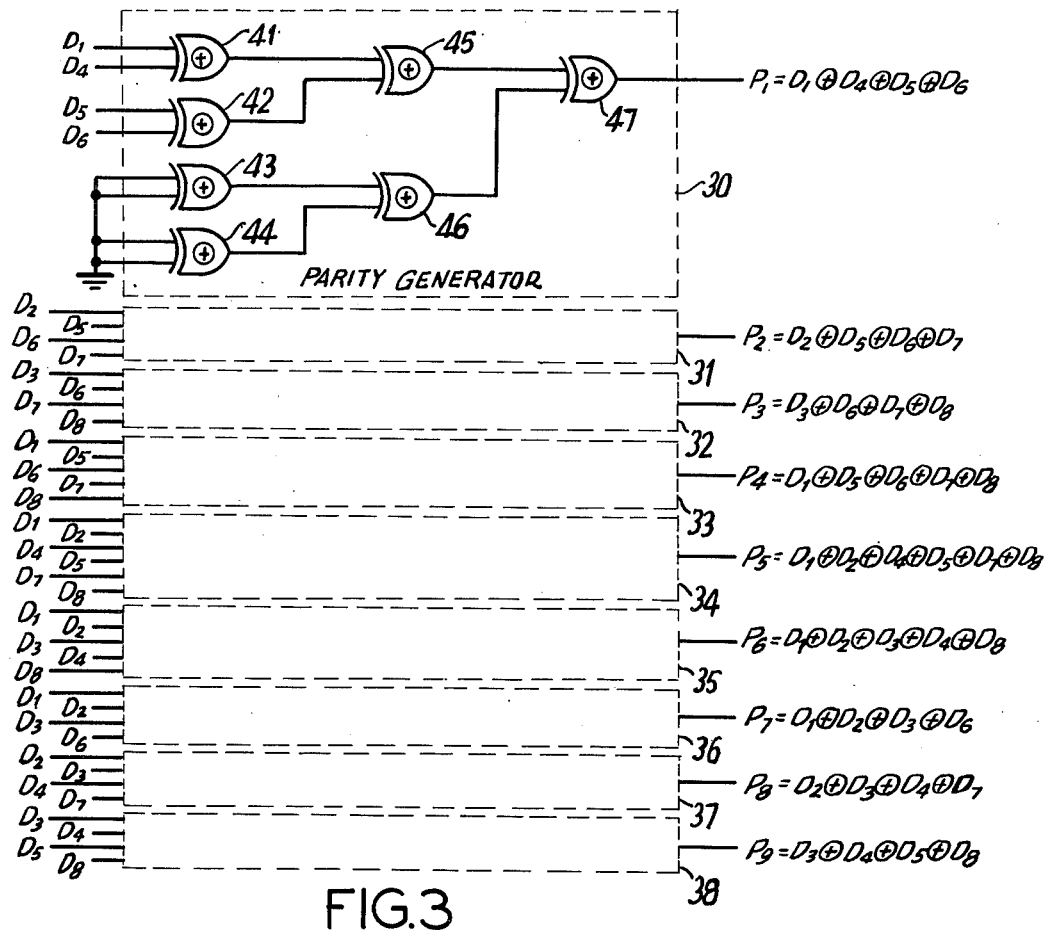
FIG. 3 is a schematic diagram illustrating parity generators for deriving the parity bits in a parallel implementation which can be used in place of the serial implementation of FIG. 2A.
FIG. 4 is a table illustrating parity bit comparison and error detection according to the invention.

With the shift register shown in FIG. 2A the parity bits are obtained by operating on the data bits in serial fashion. The same summations defined by parity equations in FIG. 2B can be obtained using parallel logic arranged as shown in FIG. 3. The serial approach generally has the advantage of requiring fewer components whereas the parallel approach generally has the advantage of higher operating speed.

The parallel logic arrangement includes nine parity generators each arranged to produce a different one of the parity bits $P_1 \ldots P_9$. Although each parity generator can be tailor made according to the corresponding parity equation, it is advantageous to use a standard arrangement suitable for all of the parity generators. Each of the parity generators is in the form of a logic tree including seven exclusive OR circuits 41-47 arranged to provide an exclusive OR (Mod-2) summation from up to eight inputs. Four of the exclusive OR circuits 41-44 are connected to the eight input terminals. The outputs of OR circuits 41-42 are summed by exclusive OR circuit 45 and the outputs of OR circuits 43 and 44 are summed in exclusive OR circuit 46. The final summation is obtained in exclusive OR circuit 47 which received its input signals from OR circuits 45 and 46. Each of the exclusive OR circuits provide Mod-2 additions. Thus, the output of OR circuit 47 is the Mod-2 summation of the eight signals applied to the input terminals of the OR circuits 41-44.

The connections for the parity generators 30-38 of the parallel logic encoder shown in FIG. 3 are in accordance with the parity equations appearing in the rightmost column of FIG. 2B. The first parity bit $P_1$ is developed by the Mod-2 summation of data bits $D_1$, $D_4$, $D_5$ and $D_6$ and, therefore, the four corresponding data bits are applied to the four input terminals of exclusive OR circuits 41 and 42, the remaining unused input terminals being grounded. Similarly, data bits $D_2$, $D_5$, $D_6$ and $D_7$ are applied to parity generator 31 to provide the second parity bit $P_2$. Likewise, data bits are applied to the inputs of parity generators 32-38 in accordance with the parity equations to develop the parity bits $P_3$ to $P_9$ respectively.

Retrieved Data Decoding

When a previously encoded word is retrieved from memory it is decoded by, in effect, subjecting the retrieved data bits to the same operation used during encoding, i.e., dividing the data bits by the same generator polynomial to provide a new set of parity bits. The new parity bits are compared with those retrieved from memory and, if there is complete agreement, the data is assumed to be error free. If the two sets of parity bits do not agree, the nature of the difference can be examined to provide error correction.

A simple technique according to this invention for comparing the two sets of parity bits is to perform a Mod-2 summation which will always result in a sum of zero if the two sets of parity bits are identical and, if they are not identical, will provide a different binary number for each difference or disagreement.

The generation of a new set of parity bits and a Mod-2 summation of the old and new parity bits is most easily achieved in the serial implementation by simply feeding all seventeen digits of N(X), the previously encoded word, (data bits $d_1$-$d_8$ followed by previously recorded parity bits $p_1$-$p_9$) into the shift register with feedback as shown in FIG. 2A. As the eight data bits are first stepped through the shift register and then subjected to the feedback, a new set of parity bits are developed and are located in stages $S_1$-$S_9$ of the shift register after seventeen clock pulses. The nine previously recorded parity bits follow the data bits into the shift register and likewise come to rest in stages $S_1$-$S_9$ of the shift register after seventeen clock pulses. The result is a Mod-2 addition of the old parity bits and the new parity bits and thus, the difference, referred to as the error decode E(X), resides in the shift register.

Thus, in the serial implementation, the same shift register arrangement (FIG. 2A) can be employed as either encoder 12 or decoder 13 (FIG. 1).

In the parallel implementation it is also possible to use the same type of hardware for decoding as was previously described for encoding. A new set of parity bits is developed using the same parity equations as were used for encoding. The previously recorded parity bits retrieved from memory are also applied to the inputs of the parity generators so that the end result is a Mod-2 summation of the old and new parity bits.

Figure 5:
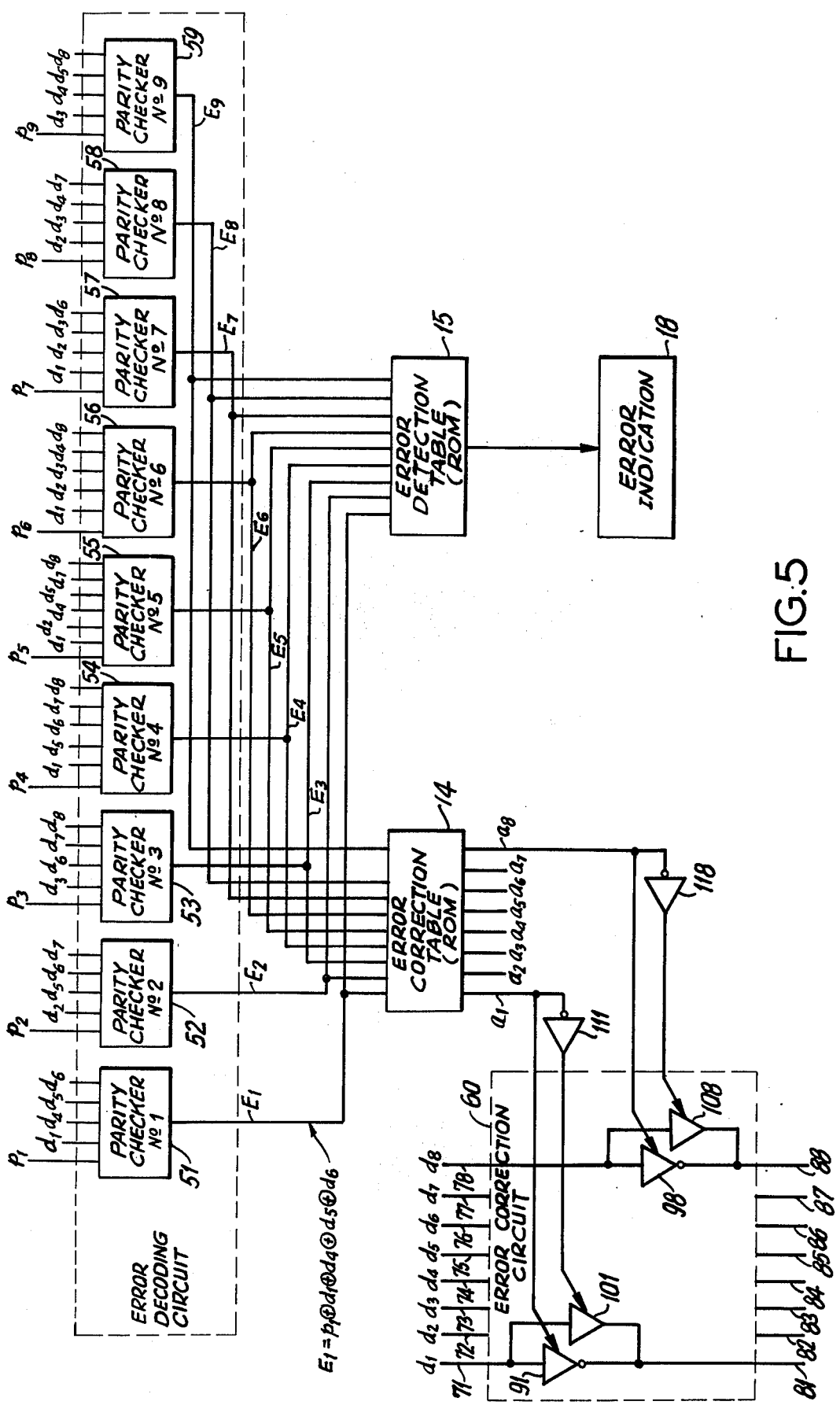
FIG. 5 is a schematic diagram illustrating the error detection and error correction portion of the system in a parallel implementation using generator polynomial G(1171).

As shown in FIG. 5, the error detecting circuits for the parallel implementation include parity checker circuits 51-59 ($PC_1$-$PC_9$) which each include seven exclusive OR circuits interconnected in the same fashion previously described for parity generator 30 in FIG. 3. In the prior encoding operation the first parity bit $P_1$ was obtained by the following parity equation:

$$P_1 = D_1 \oplus D_4 \oplus D_5 \oplus D_6. \tag{6}$$

For decoding with respect to the first parity bit, the new parity bit is generated by summing the corresponding data bits $d_1$, $d_4$, $d_5$, and $d_6$ together with the previously recorded first parity bit $p_1$ as follows:

$$E_1 = p_1 \oplus d_1 \oplus d_4 \oplus d_5 \oplus d_6. \tag{7}$$

Thus, in each case, the parity checking circuit of the error decoding system receives a set of data bits from the previously encoded word N(X) determined by the same parity equations used for encoding and, in addition, receives the previously encoded parity bit for comparison. The result is the error decode E(X) = $E_1$ ... $E_9$ appearing at the outputs of the parity checker circuits $PC_1$ ... $PC_9$ respectively.

Single and Double Error Correction

The outputs from the parity checkers are coupled to a ROM 14 which includes the single and double error look-up table as set forth fully in FIG. 6. As will be explained in more detail later if the error decode E(X) corresponds to one of the single or double error decode numbers in memory 14, the result will be an eight bit word appearing at parallel outputs of the memory designating the locations of the error or errors. For example, a numerical output indication 10000000 indicates an error in the first data bit, the number 01000000 indicates an error in the second data bit and 11000000 indicates an error in the first and second data bits.

The numerical output indications from memory 14 appear on eight ouput lines $a_1$-$a_8$ which are connected to an error correction circuit 60. The error correction circuit passes data retrieved from memory 10 (FIG. 1) applied to terminals 71-78 and passes the data through to corresponding output terminals 81-88 which are coupled to the data output unit 17 (FIG. 1). Terminal 71 for the first data bit $d_1$ is coupled to terminal 81 via an activatable inverting amplifier 91 and an activatable noninverting amplifier 101 connected in parallel thereto. The terminal $a_1$ is directly coupled to control activation of amplifier 91 and is also coupled to control activation of amplifier 101 via an inverting amplifier 111. Likewise terminal 78 for the eighth data bit $d_8$ is coupled to output terminal 88 via an activatable inverting amplifier 98 an activatable noninverting amplifier 108, terminal $a_8$ being directly coupled to amplifier 98 and to amplifier 108 via an inverting amplifier 118. A similar set of amplifiers are coupled to terminals 72-77 and terminals $a_2$-$a_7$ to transfer the remaining data bits $d_2$-$d_7$ to the output terminals 82-87, respectively.

When terminal $a_1$ for example, is "0", indicating the absence of an error, the noninverting amplifier 101 is activated and the first data bit passes from terminal 71 to 81 unaltered. On the other hand, if the signal on terminal $a_1$ is a "1", indicating that the first data bit is in error, the inverting amplifier 91 is activated automatically inverting the data as it passes from terminal 71 to 81 thereby correcting the data. In like fashion the other data bits either pass through the error correction circuit or are corrected by the inverting amplifiers as determined by the signals appearing at terminals $a_2$–$a_8$ at the output of memory 14.

The table in FIG. 4 sets forth the parity equations for the polynomial generator G(1171) in tabular form. The vertical column under the heading $P_1$ indicates that this parity bit is the summation of data bits $D_1$, $D_4$, $D_5$ and $D_6$. The second column under the heading $P_2$ indicates that the second parity bit is obtained by the summation of data bits $D_2$, $D_5$, $D_6$ and $D_7$. Likewise the remaining columns $P_3$–$P_9$ indicate the summations which form the remaining parity bits.

As an illustration, assuming that the incoming word D(X) = 01000101 as indicated in the vertical column in the upper left portion of FIG. 4, the nine corresponding parity bits for this number are P(X) = 100110001. If an error appears in the first bit $D_1$ the parity bits would change to $P(D_1)$ = 000001101. The Mod-2 summation of the original parity bits and the parity bits for the number including the error in the first digit is indicated in the horizontal line "E($D_1$) and is E($D_1$) = 100111100." If an error occurs in the first data bit, the same error decode E($D_1$) will always result regardless of the value of the data being subjected to the parity check and regardless of whether the first data bit is a "1" or a "0". This becomes apparent from reading horizontally across the top line in FIG. 4 corresponding to the data bit $D_1$. It should be noted that the data bit $D_1$ affects only parity bits $P_1$, $P_4$, $P_5$, $P_6$ and $P_7$ and, as might be expected, an error in the first data bit $D_1$ results in a "1" appearing at corresponding locations in the error decode E($D_1$).

If an error occurs in the second data bit $D_2$, as can be seen from the horizontal line corresponding to data bit $D_2$, the parity bits $P_2$, $P_5$, $P_6$, $P_7$ and $P_8$ are effected and, hence, the corresponding error decode E($D_2$) = 010011110.

When double errors occur there are self-canceling effects on the parity bits. For example, an error in the first data bit $D_1$ affects parity bits $P_5$, $P_6$ and $P_7$ and an error in the second data bit $D_2$ affects the same parity bits. After a Mod-2 addition, the effects cancel with no net change in the error decode. However, only the error in the first data bit affects parity bits $P_1$ and $P_4$, whereas only the error in the second data bit affects parity bits $P_2$ and $P_8$. Accordingly, the error decode will correspond to the non-canceling effects on parity bits $P_1$, $P_2$, $P_4$, $P_8$ and therefore E($D_1$ + $D_2$) = 110100010.

The complete single and double error correction decode table including all the values of E(X) corresponding to single and double errors is set forth in FIG. 6 together with the corresponding bit correction codes.

For convenience the tabulation of error decodes is given in decimal form although in an actual system it would be more convenient to use a digital format. As indicated in FIG. 4 the conversion of the error in the first digit $D_1$ is as follows:

$$E(D_1) = 10011100^* = 316. \qquad (8)$$

In FIG. 6 the number "316" corresponds to a bit correction code 10000000 indicating an error in the first data bit. When this bit correction code appears at the output of ROM 14 (FIG. 5) terminal $a_1$ is activated and inverting amplifier 91 automatically inverts the first data bit as it passes through error correction circuit 60 thereby automatically correcting the error.

*Error decodes are read with the least significant bit to the right as they appear in FIG. 4.

As indicated in FIG. 4 the error decode for an error in the second data bit is as follows:

$$E(D_2) = 010011110^* = 158 \qquad (9)$$

From FIG. 6 it can be seen that an error decode "158" corresponds to a bit correction 01000000 indicating the error in the second data bit. When this bit correction code appears at the output of ROM 14 terminal $a_2$ is activated so that the error correction circuit 60 will automatically correct the error in the second data bit.

As also shown in FIG. 4, the error decode for error appearing simultaneously in the first and second data bits is as follows:

$$E(D_1 + D_2) = 11010010^* = 418. \qquad (10)$$

Table 6 shows that the error decode for "418" corresponds to bit correction code 11000000 indicating that errors appear in the first and second data bits. Terminals $a_1$ and $a_2$ are activated to automatically correct the first and second data bits as they pass through error correction circuit 60.

*Error decodes are read with the least significant bit to the right as they appear in FIG. 4.

It should be noted that there is no repetition of error correction decodes in FIG. 6. Each error correction decode corresponds to a specific single or double error. Thus, each of these error decodes can be used for data correction.

From FIG. 6 it may appear that there is more than a single error decode for the single errors. For example error decodes 60, 284, 308, 312, 317, 318, 380, 444, appear to correspond to a single error in the first data bit. Actually, these error decodes correspond to double errors wherein the second error is in one of the parity bits which can be ignored in the data correct operation.

TRIPLE ERROR DETECTION

FIG. 7 is a table identifying all the error detection decodes for the triple errors and higher order errors corresponding to the generator polynomial G(1711). Since the error decodes are in the form of a nine digit binary number, there are 512 possible error decodes. These are set forth in a table using decimal notation for convenience, the tens being indicated in successive horizontal lines and the units being indicated in the vertical columns. An "X" in the table indicates that the error decode corresponds to at least one triple error whereas a "φ" in the table indicates that the error detection decode corresponds only to higher order errors.

Reading across the first horizontal line in the table FIG. 7 indicates that the error detection decode corresponds only to higher order errors.

Reading across the first horizontal line in the table FIG. 7 indicates that the error decode 7 (000000111) corresponds to a triple error. On the second horizontal line error decodes 11, 13, 14 and 19 are also indicated as corresponding to triple errors. The next line indicates that error decodes 21, 22, 25, 26 and 28 correspond to triple errors and that error decodes 23 and 29 correspond to higher order errors. The other error decodes in the table for all the triple errors and higher order errors are read in similar fashion.

It should be noted that none of the error decodes for single or double errors appear in FIG. 7. If the data has only a single or double error it is automatically corrected and, hence, there is no need to indicate the presence of an error in FIG. 7.

A specific error decode in FIG. 7 may correspond to several different errors and, hence, the error decodes in FIG. 7 are not necessarily unique in a specific error. Hence, these error decodes cannot be used for automatic error correction and it is therefore necessary to indicate the presence of an error. It is important that the polynomial generator be selected such that at least all triple errors are indicated. A polynomial generator G(1711) has been found to detect all triple errors and, will also detect 70% of all triple and higher order errors.

The error decodes corresponding to the triple errors and higher order errors are placed in a ROM 15 (FIGS. 1 and 5) and the output of the memory is coupled to an error indicating circuit 18. ROM 15 receives input signals from decoder 13 and automatically provides a signal to activate the error indicator whenever the applied error decode corresponds to one of the numbers recorded in memory 15.

SYSTEM FOR POLYNOMIAL GENERATOR G(1513)

The foregoing description has been for a system using the polynomial generator G(1171). As indicated previously, a second generator polynomial G(1513) has been found which also provides unique error decodes for all single and double errors and an error decode for at least all triple errors. Thus, a similar system can be designed using this generator polynomial which will provide single and double error correction, and triple error detection using no more than nine parity bits for an eight bit data system.

A serial encoder or decoder for the generator polynomial G(1513) is shown in FIG. 8A. A nine stage shift register including the stages $P_1$-$P_9$ each are coupled to a common clock pulse terminal 120 and a common reset terminal 121. The output of the ninth stage is fed back to stages $P_1$, $P_2$, $P_4$, $P_7$ and $P_9$ via exclusive OR circuits 122-126, respectively. The other input for OR circuit 122 is coupled to an input terminal 127 which receives the incoming data in serial form. The other inputs for the exclusive OR circuits 123-126 are derived from the output of the respective previous stages of the shift register.

The shift register shown in FIG. 8A operates similar to that previously illustrated in FIG. 2A except that, due to a different feedback arrangement, the incoming data is divided by the generator polynomial G(1513) instead of G(1171). The Mod-2 additions that take place during shifts 9-17 as a result of the feedback connections in FIG. 8A are as indicated in the table FIG. 8B. The final result after 17 shift pulses is as indicated by the final parity equations in the right hand column of FIG. 8B.

Figure 9:
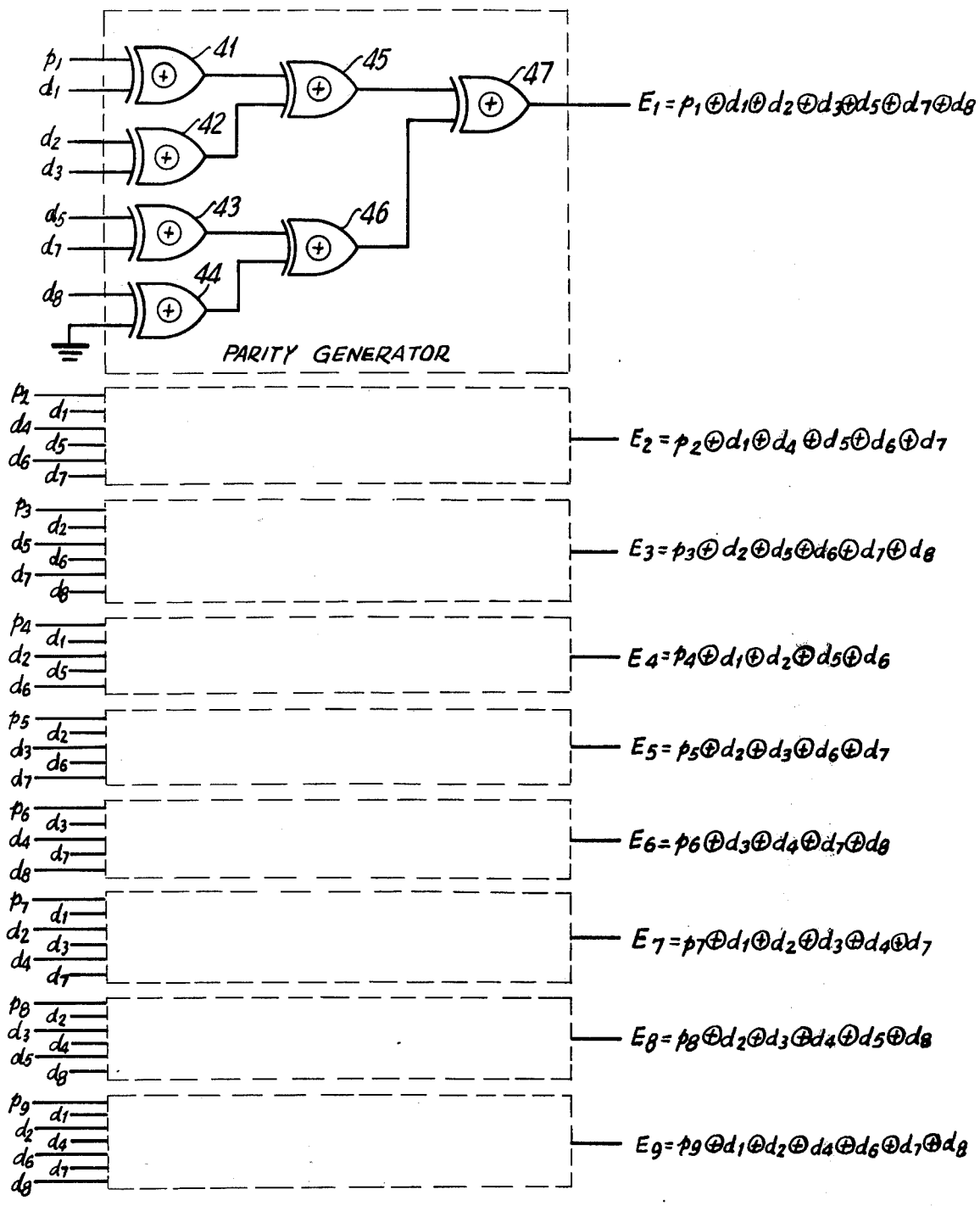
FIG. 9 is a schematic diagram illustrating the parallel logic for encoding and decoding using generator polynomial G(1513)

These parity equations can be utilized to form parallel encoding or decoding circuits as shown in FIG. 9. For example, if the unit is used as a decoder, it would include nine parity checking circuits each including seven exclusive OR circuits arranged in the manner shown for parity generator 30 in FIG. 3. Each parity checker receives inputs corresponding to the parity equations appearing in the last column of FIG. 8B and, in addition, would receive the corresponding parity bit retrieved from memory. If the unit is employed as an encoder, the parity bit input terminals $p_1$-$p_9$ are not used and therefore grounded.

The error correction decode table for the single and double errors for the generator polynomial G(1513) is set forth in FIG. 10, and the error detection decode table for the triple errors and higher order errors of the polynomial generator G(1513) is set forth in FIG. 11. In the completed system for the polynomial generator G(1513) either a serial encoder according to FIG. 8 or parallel encoder according to FIG. 9 could be utilized as encoder 12 shown in FIG. 1. Also, either a serial decoder or parallel decoder corresponding to FIGS. 8 and 9 could be utilized as the decoder 13. The error correction table in ROM 14 would correspond to that appearing in FIG. 10, and the triple error detection table recorded in ROM 15 would correspond to that appearing in FIG. 11.

Although there are many polynomial generators which will provide single and double error correction and triple error detection for eight bit data words utilizing ten or more parity bits, it is believed that the two polynomial generators G(1171) and G(1513) are unique in achieving single and double error correction and triple error detection with only nine parity bits.

While only a few illustrative embodiments have been set forth in detail, it should be apparent that there are other variations within the scope of this invention. For example, the utility of the invention is not limited to systems for recording and retrieving data, but could, for example, be equally useful in data transmission systems for detecting and correcting errors which may occur during transmission. Also, it should be apparent that suitable encoding and decoding circuits could be devised using other logic combinations. The scope of the invention is more particularly defined in the appended claims.

We claim:

1. In a nine bit parity system for eight bit data providing single and double error correction and triple error detection the combination of:

parity generating means for dividing eight bit incoming data $D(X)$ by a polynomial generator $G(X)$ to obtain a quotient $Q(X)$ and a remainder $R(X)$ consisting of nine parity bits;

encoding means connected to said parity generating means for forming a seventeen bit encoded word $M(X)$ including said nine parity bits $R(X)$ concatenated to said incoming data $D(X)$;

decoding means operatively coupled to receive previously encoded words $N(X)$ and divide at least a portion of same by said polynomial generator $G(X)$ to obtain a quotient and an error decode remainder $E(X)$, $N(X)$ being assumed equal to $M(X)$ and free of errors when $E(X)$ equals zero;

an error correction decode table including the values of $E(X)$ corresponding to all possible single and double errors in $N(X)$;

error correction means coupled to said decoding means and said error decode table to correct any single or double errors in the data bits of $N(X)$ as may be indicated by the error decode remainder; and said generator polynomial G(X) being selected to have a unique value E(X) for each possible single and double error and a value of E(X) other than zero for at least each triple error.

2. The single and double error correction, triple error detection, parity system according to claim 1 wherein said polynomial generator G(X) is:

$$G(1171) = X^9 + X^6 + X^5 + X^4 + X^3 + 1.$$

3. The single and double error correction, triple error detection, parity system according to claim 2 wherein said error correction decode table is as set forth in FIG. 6 of the drawings.

4. The single and double error correction, triple error detection, parity system according to claim 2 further comprising:
an error detection decode table including values of E(X) corresponding to triple and higher order errors in the data bits of previously encoded words N(X);
indicating means coupled to said decoding means and said error detection decode table to indicate when said error decode remainder E(X) corresponds to one of the values in said error detection decode table; and
said error detection decode table being as set forth in FIG. 7 of the drawings.

5. The single and double error correction, triple error detection, parity system according to claim 1 wherein said polynomial generator G(X) is:

$$G(1513) = X^9 + X^8 + X^6 + X^3 + X + 1.$$

6. The single and double error correciton, triple error detection, parity system according to claim 5 wherein said error correction decode table is as set forth in FIG. 9 of the drawings.

7. The single and double error correction, triple error detection, parity system according to claim 5 further comprising:
an error detection decode table including values of E(X) corresponding to triple and higher order errors in the data bits of previously encoded words N(X);
indicating means coupled to said decoding means and said error detection decode table to indicate when said error decode remainder E(X) corresponds to one of the values in said error detection decode table; and
said error detection table being as set forth in FIG. 10 of the drawings.

8. The single and double error correction, triple error detection, parity system according to claim 1 wherein said parity generating means comprises a nine stage shift register with feedback from the last stage to stages selected according to the generator polynomial G(X).

9. The single and double error correction, triple error detection, parity system according to claim 1 wherein said decoding means comprises a nine stage shift register with feedback from the last stage to stages selected according to the generator polynomial G(X).

10. The single and double error correction, triple error detection, parity system according to claim 1 wherein said parity generating means comprises parallel logic circuits for obtaining said nine parity bits according to parity equations derived from the polynomial generator G(X).

11. The single and double error correction, triple error detection, parity system according to claim 1 wherein said decoding means comprises parallel logic circuits for obtaining parity bits according to the parity equations derived from the polynomial generator G(X).

12. The single and double error correction, triple error detection, parity system according to claim 1 further comprising:
an error detection decode table including values of E(X) corresponding to triple errors and higher order errors in the data bits of previously encoded words N(X); and
indicating means coupled to said decoding means and said error detection decode table to indicate when said error decode remainder E(X) corresponds to one of the values in said error detection decode table.

13. A single and double error correction, triple error detection system according to claim 1 wherein said decoding means divides the entire encoded word N(X) by said polynomial generator G(X) to obtain said error decode remainder E(X).

14. In a nine bit parity bit system for eight bit data providing single and double error correction and triple error detection the combination of:
parity generating means including
a first nine stage shift register having feedback from the last stage to other stages selected according to a generator polynomial generator G(X), and
means for shifting said first shift register seventeen times as the eight inncoming data bits D(X) are serially advanced through said first shift register,
the nine parity bits R(X) being the bits in said first shift register after seventeen shifts;
encoding means connected to said parity generating means for forming a seventeen bit encoded word M(X) including said nine parity bits R(X) concatenated to said incoming data D(X);
encoding means including
a second nine stage shift register having feedback from the last stage to other stages selected according to a generator polynomial generator G(X);
means for shifting said second shift register seventeen times as the bits of a previously encoded word N(X) is serially advanced through said second shift register;
the nine bits remaining in said second shift register after seventeen shifts being an error decode remainder E(X) such that N(X) is assumed equal to M(X) and free of errors when E(X) equals zero;
an error correction decode table including the values of E(X) corresponding to all possible single and double errors in N(X);
error correction means coupled to said decoding means and said error decode table to correct any single or double errors in the data bits of N(X) as may be indicated by the error decode remainder; and
said generator polynomial G(X) being selected to have a unique value E(X) for each possible single and double error and a value of E(X) other than zero for at least each triple error.

15. The single and double error correction, triple error detection, parity system according to claim 14 wherein said first and second shift registers include feedback to the first, fourth, fifth, sixth and seventh stages.

16. The single and double error correction, triple error detection, parity system according to claim 14 wherein said first and second shift registers include feedback to the first, second, fourth, seventh and ninth stages.

17. In a nine bit parity system for eight bit data providing single and double error correction and triple error detection the combination of:

parity generating means including parallel logic for developing nine parity bits P(X) from incoming data D(X) using parity equations derived from the generator polynomial G(X);

encoding means connected to said parity generating means for forming a seventeen bit encoded word M(X) including said nine parity bits P(X) concatenated to said incoming data D(X);

decoding means operatively coupled to receive previously encoded words N(X) and including a parallel logic for developing an error decode remainder E(X) from the previously encoded word N(X) using parity equations derived from said generator polynomial G(X), N(X) being assumed equal to M(X) and free of errors when E(X) equals zero;

an error correction decode table including the values of E(X) corresponding to all possible single and double errors in N(X); and error correction means coupled to said decoding means and said error decode table to correct any single or double errors in the data bits of N(X) as may be indicated by the error decode remainder;

said generator polynomial equation G(X) being selected to have a unique value E(X) for each possible single and double error and a value of E(X) other than zero for at least each triple error.

18. The single and double error correction, triple error detection, parity system according to claim 17 wherein the parallel logic of said decoding means develops the error decode remainder $E(X) = E_1 \ldots E_9$ from the data bits $d_1 \ldots d_8$ and parity bits $p_1 \ldots p_8$ of the previously encoded word N(X) according to the following parity equations:

$E_1 = p_1 \oplus d_1 \oplus d_4 \oplus d_5 \oplus d_6$ $E_2 = p_2 \oplus d_2 \oplus d_5 \oplus d_6 \oplus d_7$ $E_3 = p_3 \oplus d_3 \oplus d_6 \oplus d_7 \oplus d_8$ $E_4 = p_4 \oplus d_1 \oplus d_5 \oplus d_6 \oplus d_7 \oplus d_8$ $E_5 = p_5 \oplus d_1 \oplus d_2 \oplus d_4 \oplus d_5 \oplus d_7 \oplus d_8$ $E_6 = p_6 \oplus d_1 \oplus d_2 \oplus d_3 \oplus d_4 \oplus d_8$ $E_7 = p_7 \oplus d_1 \oplus d_2 \oplus d_3 \oplus d_6$ $E_8 = p_8 \oplus d_2 \oplus d_3 \oplus d_4 \oplus d_7$ $E_9 = p_9 \oplus d_3 \oplus d_4 \oplus d_5 \oplus d_8.$ 19. The single and double error correction triple error detection, parity system according to claim 17 wherein the parallel logic of said parity generating means develops the parity bits $R(X) = P_1 \ldots P_9$ from the data $D(X) = D_1 \ldots D_8$ according to the following parity equations:

$P_1 = D_1 \oplus D_2 \oplus D_3 \oplus D_5 \oplus D_7 \oplus D_8$ $P_2 = D_1 \oplus D_4 \oplus D_5 \oplus D_6 \oplus D_7$ $P_3 = D_2 \oplus D_5 \oplus D_6 \oplus D_7 \oplus D_3$ $P_4 = D_1 \oplus D_2 \oplus D_5 \oplus D_6$ $P_5 = D_2 \oplus D_3 \oplus D_6 \oplus D_7$ $P_6 = D_3 \oplus D_4 \oplus D_7 \oplus D_8$ $P_7 = D_1 \oplus D_2 \oplus D_3 \oplus D_4 \oplus D_7$ $P_8 = D_2 \oplus D_3 \oplus D_4 \oplus D_5 \oplus D_8$ $P_9 = D_1 \oplus D_2 \oplus D_4 \oplus D_6 \oplus D_7 \oplus D_8.$ 20. The single and double error correction, triple error detection, parity system according to claim 17 wherein the parallel logic of said decoding means develops the error decode remainder $E(X) = E_1 \ldots E_9$ from the data bits $d_1 \ldots d_8$ and parity bits $p_1 \ldots p_8$ of the previously encoded word N(X) according to the following parity equation:

$E_1 = p_1 \oplus d_1 \oplus d_2 \oplus d_3 \oplus d_5 \oplus d_7 \oplus d_8$ $E_2 = p_2 \oplus d_1 \oplus d_4 \oplus d_5 \oplus d_6 \oplus d_7$ $E_3 = p_3 \oplus d_2 \oplus d_5 \oplus d_6 \oplus d_7 \oplus d_8$ $E_4 = p_4 \oplus d_1 \oplus d_2 \oplus d_5 \oplus d_6$ $E_5 = p_5 \oplus d_2 \oplus d_3 \oplus d_6 \oplus d_7$ $E_6 = p_6 \oplus d_3 \oplus d_4 \oplus d_7 \oplus d_8$ $E_7 = p_7 \oplus d_1 \oplus d_2 \oplus d_3 \oplus d_4 \oplus d_7$ $E_8 = p_8 \oplus d_2 \oplus d_3 \oplus d_4 \oplus d_5 \oplus d_8$ $E_9 = p_9 \oplus d_1 \oplus d_2 \oplus d_4 \oplus d_6 \oplus d_7 \oplus d_8.$

* * * * *